United States Patent
Nakashima

[11] Patent Number: 5,991,219
[45] Date of Patent: Nov. 23, 1999

[54] SEMICONDUCTOR MEMORY DEVICE PROVIDED WITH A SENSE AMPLIFIER HAVING A TRIMMING CAPABILITY

[75] Inventor: Katsuya Nakashima, Nagasaki, Japan

[73] Assignee: Sony Corporation, Japan

[21] Appl. No.: 08/982,339

[22] Filed: Dec. 2, 1997

[30] Foreign Application Priority Data

Dec. 3, 1996 [JP] Japan ................................. 8-322472

[51] Int. Cl.$^6$ .................................................. G11C 7/00
[52] U.S. Cl. ........................ 365/225.7; 365/205; 365/201
[58] Field of Search ................................ 365/225.7, 205, 365/201

[56] References Cited

U.S. PATENT DOCUMENTS

| 4,281,398 | 7/1981 | McKenny et al. | 365/200 |
| 5,305,267 | 4/1994 | Haraguchi et al. | 365/225.7 |
| 5,434,822 | 7/1995 | Deleganes et al. | 365/203 |
| 5,596,538 | 1/1997 | Joo | 365/225.7 |

*Primary Examiner*—David Nelms
*Assistant Examiner*—Tuan T. Nguyen
*Attorney, Agent, or Firm*—Ronald P. Kananen; Rader, Fishman & Grauer

[57] ABSTRACT

A sense amplifier is provided with a trimming capability to provide a semiconductor memory device capable of a reading operation at higher speeds than related-art technology. A trimming means (8) is provided for controlling a trimming block (7) in a sense amplifier (5) to perform a trimming operation. A fuse is used for the trimming means (8). The fuse is cut at a necessary position at any given time after fabrication, thereby allowing initialization for reducing the input offset of the sense amplifier (5).

8 Claims, 3 Drawing Sheets

TRIMMING BLOCK

SEMICONDUCTOR MEMORY DEVICE PROVIDED WITH A SENSE AMPLIFIER HAVING A TRIMMING CAPABILITY

BACKGROUND OF THE INVENTION

The present invention generally relates to the access speed of a semiconductor memory device, typically an SRAM (Static Random Access Memory) device, capable of high-speed reading and, more particularly, to the operational speed of a sense amplifier.

Conventional sense amplifiers use a MOS (Metal Oxide Semiconductor) transistor constitution by taking low power consumption characteristic into consideration. One example of such a constitution was reported by Yoshiyuki Haraguchi, et al. in "1997 Symposium on VLSI Circuits Digest of Technical Papers," p. 80.

However, the semiconductor memory device having a MOS transistor based sense amplifier has a defect of a large (about 20 mV) sense amplifier input offset. In such a constitution, therefore, an operation is kept in a wait state until the signal level on a bit line is raised above that input offset, thereby preventing high-speed reading.

For example, for a sense amplifier having an input offset (20 mV) at which data Q (1 for example) is outputted with ease to output data NQ (0 for example), a read operation must be kept in a wait state until an input signal ND having at least 20 mV appears on the bit line. Therefore, the above-mentioned constitution requires an excess read time as compared with the constitution having an input offset of 0 mV, presenting a problem of being disadvantageous in high-speed reading.

OBJECT AND SUMMARY OF THE INVENTION

It is therefore an object of the present invention to provide a semiconductor memory device capable of high-speed reading by providing a sense amplifier of this device with a trimming capability.

In carrying out the invention and according to one aspect thereof, there is provided a semiconductor memory device provided with a sense amplifier having a trimming capability, comprising a trimming means for trimming the sense amplifier, thereby lowering the input offset of the sense amplifier after fabrication.

The above-mentioned novel constitution reduces (or minimizes) the input offset of even a sense amplifier having an input offset, thereby allowing a read operation to be executed immediately at a level where a bit line potential difference is still small.

According to another aspect of the invention, there is provided a semiconductor memory device provided with a sense amplifier having a trimming capability, comprising a trimming amount measuring means for measuring the input offset of the sense amplifier at any given time after fabrication.

The above-mentioned novel constitution automates a trimming setting operation, thereby enhancing usage efficiency.

According to still another aspect of the invention, there is provided a semiconductor memory device provided with a sense amplifier having a trimming capability, wherein a fuse is used for the above-mentioned trimming means, thereby reducing the input offset by cutting the fuse at a necessary position at any given time after fabrication.

The above-mentioned novel constitution allows an initial setting operation by a simplified constitution and with reliability.

According to yet another aspect of the invention, there is provided a semiconductor memory device provided with a sense amplifier having a trimming capability, wherein a nonvolatile memory device such as an EPROM (Erasable Programmable Read-Only Memory) is incorporated as the above-mentioned trimming means to reduce the input offset based on information stored in this nonvolatile memory device.

The above-mentioned novel constitution allows even a constitution of a large trimming information amount to perform storage, thereby making the invention applicable to a memory device having a large amount of trimming information.

According to a further aspect of the invention, there is provided a semiconductor memory device provided with a sense amplifier having a trimming capability, wherein a MOS (Metal Oxide Semiconductor) transistor is provided as the above-mentioned trimming means and a large amount of hot carriers are passed through a particular MOS transistor to vary the threshold voltage, thereby supplying a trimming signal.

The above-mentioned novel constitution allows an initial setting operation by a simplified and low-cost constitution and with reliability, thereby enhancing product reliability.

The semiconductor memory device provided with a sense amplifier having a trimming capability associated with the invention comprises a trimming means for trimming the sense amplifier and constituted such that the input offset of the above-mentioned sense amplifier is reduced at any given time after fabrication. Consequently, if the sense amplifier using a MOS device has an input offset, the same can be reduced (or minimized) by trimming and a read operation can be executed immediately at a level where a bit line potential difference is still small, thereby allowing a high-speed read operation.

The semiconductor memory device provided with a sense amplifier having a trimming capability associated with the invention comprises the means for setting a necessary trimming amount by measuring the input offset of the above-mentioned sense amplifier at any given time after fabrication. Consequently, the trimming amount setting operation is automated, thereby enhancing usage efficiency.

The semiconductor memory device provided with a sense amplifier having a trimming capability associated with the invention uses a fuse for the trimming means and the fuse is cut at a necessary position at any given time after fabrication. Consequently, the initial setting operation can be performed by a simplified constitution and with reliability, thereby enhancing product reliability.

The semiconductor memory device provided with a sense amplifier having a trimming capability associated with the invention incorporates a nonvolatile memory device such as an EPROM as the trimming means to reduce the input offset based on information stored in the incorporated nonvolatile memory device. Consequently, even a constitution having a large trimming information amount can perform storage, making the invention applicable to a memory device having a mass storage constitution.

The semiconductor memory device provided with a sense amplifier having a trimming capability associated with the invention comprises a MOS transistor as the trimming means and causes a large amount of hot carriers to flow through a particular MOS transistor based on MOS transistor hot carrier characteristic to vary the threshold voltage, thereby supplying a trimming signal. Consequently, an initial setting operation can be performed by a simplified and low-cost constitution and with reliability, thereby enhancing product reliability.

The above and other objects, features and advantages of the present invention will become more apparent from the accompanying drawings, in which like reference numerals are used to identify the same or similar parts in several views.

DETAILED DESCRIPTION OF PREFERRED EMBODIMENTS

This invention will be described in further detail by way of example with reference to the accompanying drawings.

Figure 1:
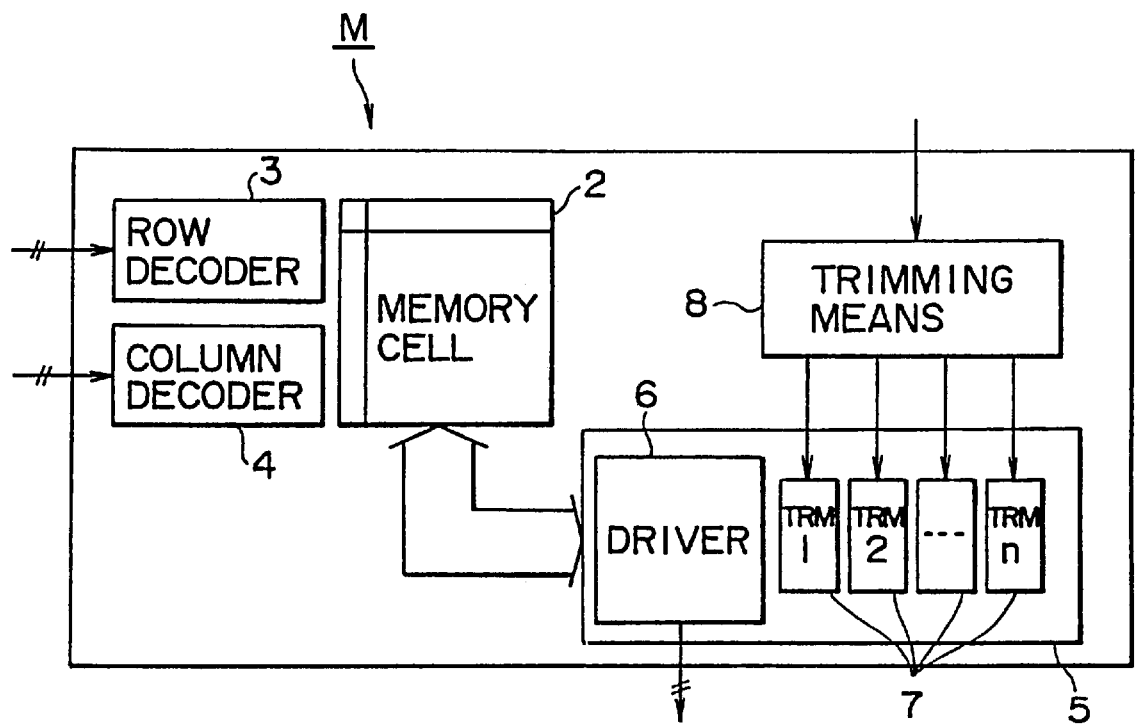
FIG. 1 is a block diagram illustrating a semiconductor memory device provided with a sense amplifier having a trimming capability practiced as one preferred embodiment of the invention.

Referring to FIG. 1, there is shown a block diagram illustrating a semiconductor memory device provided with a sense amplifier having a trimming capability practiced as one preferred embodiment of the invention.

As shown in the figure, a semiconductor memory device M comprises a memory cell 2, a decoder 3 (for row), a decoder 4 (for column), a sense amplifier 5, and a trimming means 8, the sense amplifier 5 being composed of a driver 6 and a trimming block 7.

The trimming means 8 is constituted to control the trimming block 7, trimming the sense amplifier 5.

Figure 2:
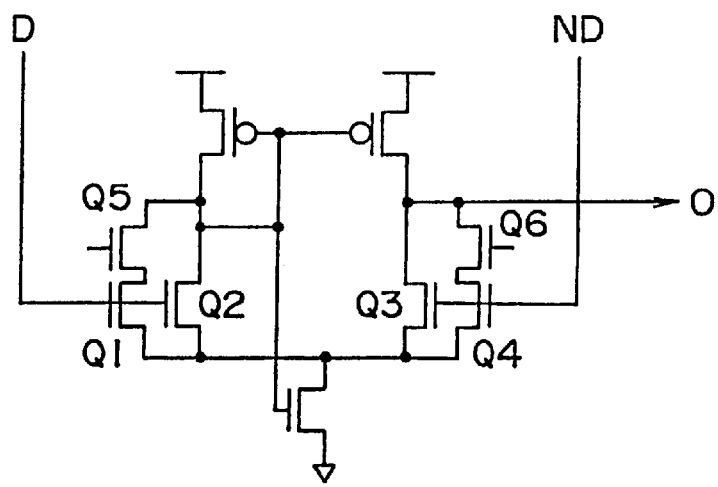
FIG. 2 is a circuit diagram illustrating a sense amplifier shown in FIG. 1 practiced as one preferred embodiment of the invention.

A circuit diagram of the sense amplifier 5 is shown in FIG. 2.

In the figure, Q2 and Q3 are normally used MOS devices and Q1 and Q4 are MOS devices intended for performing trimming. Q5 and Q6 are MOS devices for setting a type of trimming to be performed, which are normally in an OFF state.

First, if an output O is in a state for outputting data Q, namely if an input ND is higher in potential than an input D, the output O becomes an intermediate potential. At this moment, turning on the Q6 increases a current that flows from the output O to ground, thereby changing the characteristic of the sense amplifier in the direction of canceling the input offset. Conversely, if the output O is in a state for outputting data NQ, namely if the input D is higher in potential than the input ND, trimming is performed by turning on Q5.

Figure 3:
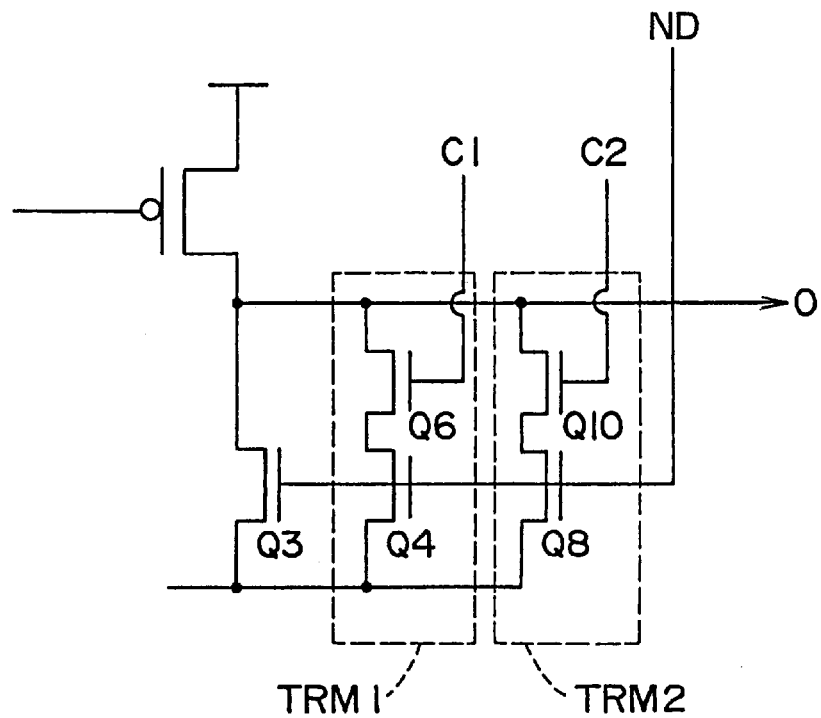
FIG. 3 is a circuit diagram illustrating the sense amplifier shown in FIG. 1 practiced as another preferred embodiment of the invention.

FIG. 3 shows a constitution incorporating two trimming blocks, a first trimming block TRM1 and a second trimming block TRM2.

The first trimming block TRM1 is turned on/off by a control signal c1 to Q6 and designed such that, when this block is on, an input offset adjustment of 5 mV for example is enabled.

The second trimming block TRM2 is turned on/off by a control signal c2 to Q10 and designed such that, when this block is on, an input offset adjustment of 10 mV for example is enabled.

Consequently, trimming adjustments of 5, 10, and 15 mV are enabled by combinations of the control signals c1 and c2.

If the trimming means 8 shown in FIG. 1 is composed of a fuse array circuit, control inputs c1 and c2 are supplied as the output of this fuse array circuit. For example, if the optimum trimming adjustment value of a certain sense amplifier is measured to be 15 mV, the fuse of the output circuit to the first trimming block TRM1 and the fuse of the output circuit to the second trimming block TRM2 are not blown, providing a conductive state. This allows both control signals c1 and c2 to be outputted and therefore the first and second trimming blocks TRM1 and TRM2 both operate, thereby setting the input offset of the sense amplifier to the minimum 5 mV.

Namely, if there are two trimming MOS devices for input offsets 5 mV and 10 mV, the offset of maximum plus/minus 20 mV can be reduced to plus/minus 5 mV. Thus, provision or a plurality of trimming blocks can make trimming of multiple levels.

Figure 4:
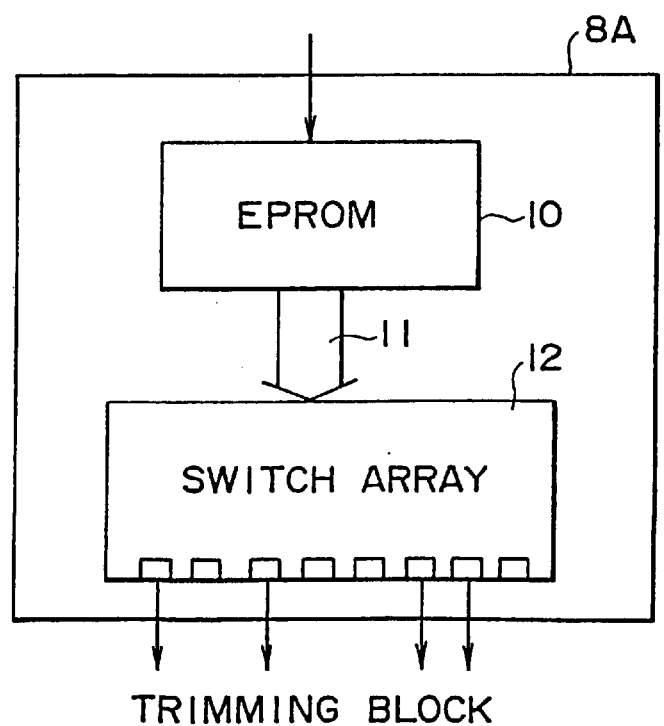
FIG. 4 is a block diagram illustrating a trimming means shown in FIG. 1 practiced as one preferred embodiment of the invention.

FIG. 4 shows a block diagram illustrating the trimming means shown in FIG. 1 practiced as one preferred embodiment.

As shown in the figure, a trimming means 8A comprises an EPROM 10 for storing and supplying trimming information 11 and a switch array 12 for turning on/off a signal to the trimming blocks according to the trimming information 11.

When the microcomputer-based system is powered on, generally a monitor program is executed as a start operation and a memory check module of the monitor program checks the state of the memory cell incorporated in this system. If the memory is found normal, the system starts operating.

Here, the system is constituted such that a trimming start module for the memory sense amplifier 5 is prepared in the monitor program in advance as a software module to be executed before the execution of the above-mentioned memory check module and, when this trimming start module is executed, the switch array 12 for the sense amplifier is selectively set according to the trimming information stored in the EPROM 10.

The above-mentioned constitution allows access to the trimming information stored in the EPROM 10 every time the system is powered on to turn on/off the switch array 12 according to this information, thereby initializing the optimum trimming constitution of the sense amplifier 5.

When the above-mentioned initialization is completed, the sense amplifier 5 in the optimum trimming constitution is driven, the memory check module checks the state of the memory cell 2 and, if the memory cell 2 is found normal, the operation gets started.

In the above description, the EPROM is used for the trimming information storage means by way of example. It will be apparent that various other nonvolatile memory devices may be used for trimming information storage.

Figure 5:
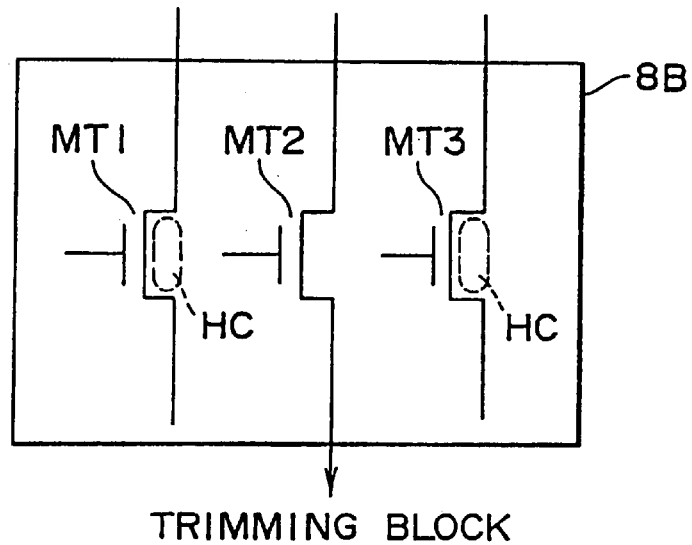
FIG. 5 is a block diagram illustrating the trimming means shown in FIG. 1 practiced as another preferred embodiment of the invention.

FIG. 5 shows a circuit diagram illustrating the trimming means shown in FIG. 1 practiced as another preferred embodiment of the invention.

As shown in the figure, a trimming means 8B comprises MOS transistors MT1 through MT3.

When a large voltage is applied between the source and drain of a MOS transistor with its gate length constant, a strong electric field is formed between the source and drain. This strong electric field increases the speed of electrons passing through channel and the electrons collide with Si atoms, generating carriers (electrons and holes). Because these carriers increase the charge amount in the gate oxide film, a hot carrier effect is generated in which no current flows as a certain operating time passes.

Therefore, based on this hot carrier characteristic of the MOS transistor, a large amount of hot carriers HC are passed through the MT1 and MT3 in the figure for example and vary the threshold voltage to stop the current, thereby constituting the trimming information.

Figure 6:
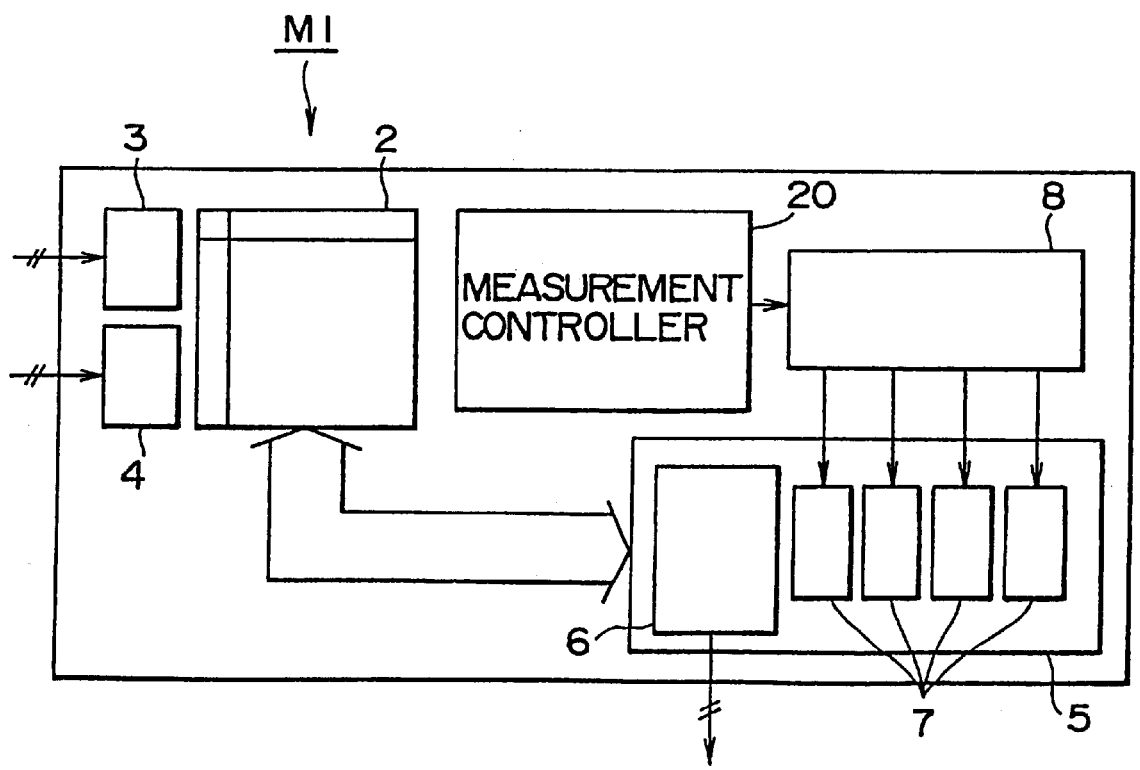
FIG. 6 is a block diagram illustrating the semiconductor memory device provided with a sense amplifier having a trimming capability practiced as another preferred embodiment of the invention.

FIG. 6 shows a block diagram illustrating the semiconductor memory device provided with a sense amplifier having a trimming capability practiced as another preferred embodiment of the invention.

As shown in the figure, a semiconductor memory M1 incorporates a measurement controller 20 that gives instructions to the trimming means 8. The other blocks comprising this embodiment are generally the same as those of the embodiment mentioned before.

A trimming value can be measured as follows. Referring to FIG. 2, the potential difference between the inputs D and ND is set to 0. Because the sense amplifier shown in FIG. 2 is followed by another sense amplifier and still another sense amplifier, if the input potential difference is exactly 0, some data appears at the output. At this moment, if data 0 still appears when Q5 is turned on and the same read operation is performed, the input offset can be further reduced by turning on Q5.

On the other hand, when data 1 is outputted, the input offset can be reduced more by turning off Q5. If the first output data is 1, Q6 is turned on and the same measurement is performed. If the output data is still 1, the input offset can be reduced more by turning on Q6. If the data 0 is outputted, the input offset can be reduced more by turning off Q5.

Repeating the above-mentioned operation can set the optimum trimming value. Applying the obtained optimum trimming value can reduce the input offset.

The trimming information thus obtained can be stored for each of the sense amplifiers by use of the above-mentioned storage means such as the fuse, EPROM, and hot carriers. Once the input offset is optimized at shipment, the device can be used with this optimized input offset after shipment.

As described and according to the invention, the semiconductor memory device provided with a sense amplifier having a trimming capability cancels the input offset of the sense amplifier generated in fabrication by trimming, after fabrication, the sense amplifier composed of a MOS device for reading, thereby realizing high-speed reading. Further, the novel constitution allows automatic setting of the input offset by incorporating a trimming measurement capability.

While the preferred embodiments of the present invention have been described using specific terms, such description is for illustrative purposes only, and it is to be understood that changes and variations may be made without departing from the spirit or scope of the appended claims.

What is claimed is:

1. A semiconductor memory device provided with a sense amplifier having a trimming capability comprising a trimming means for trimming said sense amplifier by optimizing an input voltage level of said sense amplifier by programming a non-volatile memory to provide a most sensitive bias point of said sense amplifier, thereby allowing an input offset setting such that an input offset of said sense amplifier is lowered at any given time after fabrication.

2. The semiconductor memory device provided with a sense amplifier having a trimming capability as claimed in claim 1, further comprising a trimming amount setting means for setting a necessary trimming amount by measuring the input offset of said sense amplifier at any given time after fabrication.

3. The semiconductor memory device provided with a sense amplifier having a trimming capability as claimed in claim 1, wherein said nonvolatile memory device is incorporated as said trimming means to lower the offset based on information stored in said nonvolatile memory device.

4. The semiconductor memory device provided with a sense amplifier having a trimming capability as claimed in claim 2, wherein said nonvolatile memory device is incorporated as said trimming means to lower the offset based on information stored in said non-volatile memory device.

5. The semiconductor memory device provided with a sense amplifier having a trimming capability as claimed in claim 1, wherein a metal oxide semiconductor transistor is provided as said trimming means and a relatively large quantity of hot carriers is passed through said metal oxide semiconductor transistor based on hot carrier characteristic of said metal oxide semiconductor to vary a threshold voltage, thereby providing a trimming signal.

6. The semiconductor memory device provided with a sense amplifier having a trimming capability as claimed in claim 2, wherein a metal oxide semiconductor transistor is provided as said trimming means and a relatively large quantity of hot carriers is passed through said metal oxide semiconductor transistor based on hot carrier characteristic of said metal oxide semiconductor to vary a threshold voltage, thereby providing a trimming signal.

7. The semiconductor memory device as claimed in claim 3 wherein said nonvolatile memory device is an erasable programmable read-only memory.

8. The semiconductor device as claimed in claim 4 wherein said nonvolatile memory device is an erasable programmable read-only memory.

* * * * *